(12) United States Patent
Araki et al.

(10) Patent No.: US 8,764,998 B2
(45) Date of Patent: *Jul. 1, 2014

(54) METHOD FOR MANUFACTURING COMPOSITE SUBSTRATE

(75) Inventors: Kiyoto Araki, Nagaokakyo (JP); Takashi Iwamoto, Nagaokakyo (JP); Hajime Kando, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/192,500

(22) Filed: Jul. 28, 2011

(65) Prior Publication Data

US 2011/0277928 A1 Nov. 17, 2011

Related U.S. Application Data

(63) Continuation of application No. PCT/JP2010/050246, filed on Jan. 13, 2010.

(30) Foreign Application Priority Data

Jan. 29, 2009 (JP) ................................ 2009-017855

(51) Int. Cl.
*H01B 13/00* (2006.01)

(52) U.S. Cl.
USPC ......................................... 216/20; 156/247

(58) Field of Classification Search
USPC .............. 216/62, 87; 156/247, 344; 310/311, 310/313 R; 438/458; 117/915; 29/25.35
See application file for complete search history.

(56) References Cited

U.S. PATENT DOCUMENTS

| 6,426,583 | B1 | 7/2002 | Onishi et al. |
| 6,445,265 | B1 | 9/2002 | Wright |
| 6,486,008 | B1 | 11/2002 | Lee |
| 8,601,657 | B2 * | 12/2013 | Ito .............................. 29/25.35 |

(Continued)

FOREIGN PATENT DOCUMENTS

| EP | 0 954 014 A1 | 11/1999 |
| JP | 11-307472 A | 11/1999 |

(Continued)

OTHER PUBLICATIONS

Official Communication issued in International Patent Application No. PCT/JP2010/050246, mailed on Feb. 9, 2010.

(Continued)

*Primary Examiner* — Binh X Tran
*Assistant Examiner* — David Cathey, Jr.
(74) *Attorney, Agent, or Firm* — Keating & Bennett, LLP

(57) ABSTRACT

A method for manufacturing a composite substrate that prevents undesirable effects of etching a thin film includes a pattern forming step, an ion implanting step, a bonding step, and a separation step. In the pattern forming step, a pattern region and a reverse pattern region are formed on a principal surface of a functional material substrate. In the ion implanting step, by implanting ions into the functional material substrate, a separation layer is formed inside at a certain distance from the surface of each of the pattern region and the reverse pattern region. In the bonding step, the functional material substrate at the pattern region is bonded to a supporting substrate. In the separation step, the pattern region is separated from the functional material substrate, and the reverse pattern region is made to fall off.

2 Claims, 4 Drawing Sheets

(56) References Cited

U.S. PATENT DOCUMENTS

| | | | |
|---|---|---|---|
| 2004/0222717 A1 | 11/2004 | Matsuda et al. | |
| 2004/0226162 A1 | 11/2004 | Miura et al. | |
| 2006/0033595 A1 | 2/2006 | Nagao et al. | |
| 2007/0175384 A1* | 8/2007 | Bruderl et al. | 117/89 |
| 2007/0199186 A1 | 8/2007 | Yoshino et al. | |
| 2007/0200459 A1* | 8/2007 | Yoshino et al. | 310/324 |
| 2007/0236310 A1* | 10/2007 | Fazzio et al. | 333/187 |
| 2008/0242050 A1* | 10/2008 | Yamazaki et al. | 438/458 |
| 2010/0088868 A1* | 4/2010 | Kando et al. | 29/25.35 |
| 2010/0107388 A1* | 5/2010 | Iwamoto | 29/25.35 |
| 2010/0112233 A1* | 5/2010 | Iwamoto et al. | 427/523 |

FOREIGN PATENT DOCUMENTS

| | | |
|---|---|---|
| JP | 2000-150835 A | 5/2000 |
| JP | 2001-060846 A | 3/2001 |
| JP | 2001-244444 A | 9/2001 |
| JP | 2002-534886 A | 10/2002 |
| JP | 2003-017967 A | 1/2003 |
| JP | 2004-336503 A | 11/2004 |
| JP | 2004-343359 A | 12/2004 |
| JP | 2007-228319 A | 9/2007 |
| WO | 2005/060091 A1 | 6/2005 |

OTHER PUBLICATIONS

Iwamoto et al., "Method for Manufacturing Piezoelectric Device", U.S. Appl. No. 12/608,113, filed Oct. 29, 2009.

Iwamoto, "Method for Manufacturing Electronic Device and Method for Manufacturing Piezoelectric Device", U.S. Appl. No. 12/608,115, filed Oct. 29, 2009.

* cited by examiner

METHOD FOR MANUFACTURING COMPOSITE SUBSTRATE

BACKGROUND OF THE INVENTION

1. Field of the Invention

The present invention relates to a method for manufacturing a composite substrate in which a functional material thin film separated from a substrate composed of a functional material, such as a piezoelectric, pyroelectric, or ferroelectric material, is bonded to the principal surface of a supporting substrate.

2. Description of the Related Art

In recent years, devices using a thin film composed of a functional material have been developed. In the case where a piezoelectric material is used as the functional material, a method may be employed in which a thin film is formed by depositing a piezoelectric material by sputtering, CVD, or the like, or a method may be employed in which a thin film is formed by grinding of a single-crystalline substrate (for example, refer to Japanese Unexamined Patent Application Publication No. 2007-228319).

One example of the device using a piezoelectric thin film is a film bulk acoustic resonator (FBAR) in which a thin film having electrodes provided on the upper and lower surfaces thereof is arranged above a space provided on a supporting substrate so as to be vibrated (for example, refer to International Publication No. WO2005/060091). In the method for manufacturing the FBAR, a thin film is bonded onto a supporting substrate provided with a sacrificial layer, and the sacrificial layer is removed by etching to form a space for oscillation. In the etching process, a pattern, e.g., a via hole, is formed in the thin film to expose the sacrificial layer so that an etchant can reach the sacrificial layer.

Furthermore, a method may be employed in which a release layer is formed by hydrogen ion implantation at a depth of several microns in a crystalline substance of a functional material, and after the crystalline substance is bonded to a supporting substrate, the crystalline substance is cut by heat treatment to form a thin film (for example, refer to Japanese Unexamined Patent Application Publication No. 11-307472 and Japanese Unexamined Patent Application Publication No. 2002-534886). In the method for manufacturing the thin film, the thin film is bonded onto the entire surface of the supporting substrate. Consequently, it is necessary to form a via hole in the thin film in order to extend an electrode from the lower surface to the upper surface of the thin film, or the like.

As described above, in order to form a thin film composed of a functional material by patterning on a supporting substrate, conventionally, a method has been employed in which, after the thin film is bonded to the supporting substrate, the thin film is etched to partially remove the functional material.

However, there are many problems to be solved in a thin film composed of a functional material. For example, it takes too much time to form a pattern because the functional material itself is difficult to etch, and an electrode and a supporting substrate under the functional material are damaged. If it takes time to etch, it becomes a problem that the functional material is damaged and sticking of the resist occurs as a result of etching. In particular, in the case where the functional material is lithium niobate or lithium tantalate, which is a piezoelectric material, lithium compounds produced by etching are chemically stable and inhibit etching, thus greatly affecting the etching time and manufacturing cost. Furthermore, in the case where the functional material is a piezoelectric material, a pyroelectric material, or the like, it becomes a problem that polarization of the substrate may be degraded by etching.

SUMMARY OF THE INVENTION

Accordingly, preferred embodiments of the present invention provide a method for manufacturing a composite substrate, in which undesirable effects of etching are prevented without using the conventional method in which a thin film is patterned by penetrating a functional material by etching only.

A method for manufacturing a composite substrate according to a preferred embodiment of the present invention includes a pattern forming step, an ion implanting step, a bonding step, and a separating step. In the pattern forming step, a pattern region and a reverse pattern region are formed on a principal surface of a functional material substrate. The pattern region is formed with a predetermined pattern, and the reverse pattern region is located lower than the pattern region. In the ion implanting step, by implanting ions into the pattern region and the reverse pattern region, a release layer is formed inside at a certain distance from the surface of the pattern region. In the bonding step, the functional material substrate at the pattern region is bonded to a flat principal surface of a supporting substrate. In the separating step, a thin film composed of a functional material is separated from the pattern region of the functional material substrate, and the thin film composed of the functional material is made to fall off from the reverse pattern region of the functional material substrate.

According to this manufacturing method, using a difference in level between the pattern region and the reverse pattern region, the thin film composed of the functional material bonded to the supporting substrate is separated from the pattern region, and the thin film composed of the functional material falling off from the reverse pattern region is removed from the composite substrate. As a result, the thin film composed of the functional material patterned in the same shape as the pattern region only can be bonded to the supporting substrate, and the electrode and the supporting substrate under the functional material are not damaged by etching. Thus, undesirable effects of etching can be prevented.

Preferably, the difference in level between the pattern region and the reverse pattern region is smaller than the thickness of the thin film.

Accordingly, the amount of processing in the pattern forming step can be reduced. Consequently, even if this step is performed by etching, damage due to etching of the functional material substrate and etching time can be prevented, and undesirable effects of etching can be prevented.

Preferably, the functional material substrate is composed of a piezoelectric single-crystalline substance of lithium tantalate or lithium niobate, the thin film composed of the functional material preferably is a bulk wave device thin film or a plate wave device thin film, the supporting substrate is provided with an vibrating space for the thin film composed of the functional material, and the method includes, after the separating step, a step of introducing an etchant for a sacrificial layer provided in the vibrating space from the position where the thin film composed of the functional material has fallen off.

A substrate material containing lithium, such as lithium tantalate or lithium niobate, is hard to react chemically and hard to etch. Therefore, by decreasing the amount of processing of the functional material substrate, it is possible to reduce and minimize the processing time and sticking of the resist when a resist mask is used. Furthermore, it is possible to omit the step of forming a via hole for removing the sacrificial layer, and a degradation in polarization of the thin film composed of the functional material can be prevented.

According to various preferred embodiments of the present invention, the thin film composed of the functional material that has fallen off from the reverse pattern region is removed from the supporting substrate. Consequently, the thin film composed of the functional material bonded to the supporting substrate can be obtained by separation from the pattern region, and the electrode and the supporting substrate under the functional material are not damaged by etching. Thus, undesirable effects of etching can be prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A method for manufacturing a composite substrate according to a first preferred embodiment of the present invention will be described.

Figure 1:
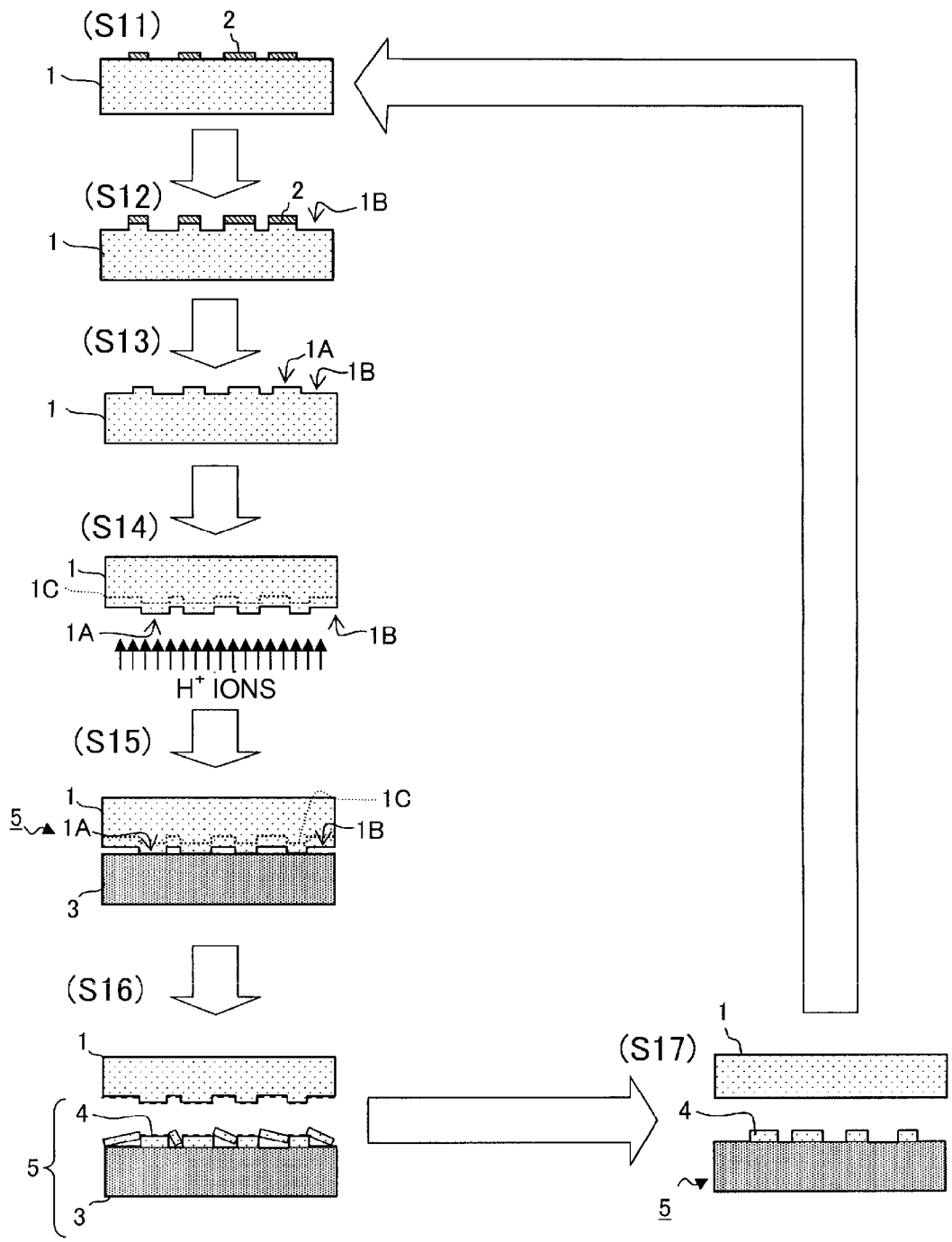
FIG. 1 is a flow chart of a method for manufacturing a composite substrate according to a first preferred embodiment of the present invention, showing the state of the substrate in each step.

FIG. 1 is a flow chart of a method for manufacturing a composite substrate according to the present preferred embodiment, showing the state of the substrate in each step.

First, a functional material substrate 1 having a flat principal surface that has been subjected to mirror polishing is prepared. Then, a resist layer 2 is formed by photolithography, in the same shape as the pattern of the required functional material thin film, on the principal surface of the functional material substrate (S11). Next, by performing dry etching, wet etching, or the like on the surface of the functional material substrate 1 on which the resist layer has been formed, the functional material is partially removed to form a reverse pattern region 1B (S12). Then, by removing the resist layer 2, a pattern region 1A remaining under the resist layer 2 is exposed (S13). Here, the etching depth preferably is about 0.5 µm, for example. These steps correspond to the pattern forming step according to a preferred embodiment of the present invention.

Next, hydrogen ions are implanted from the surface of each of the pattern region 1A and the reverse pattern region 1B of the functional material substrate 1 (S14). As a result, a release layer 1C is formed inside at a certain distance from the surface of each of the regions. Here, the depth at which the release layer 1C is formed preferably is about 1.0 µm, for example. This step corresponds to the ion implanting step of the present invention.

Furthermore, a supporting substrate 3 is prepared, and the functional material substrate 1 at the pattern region 1A is directly bonded to the supporting substrate 3 to form a composite substrate 5 (S15). This step corresponds to the bonding step according to a preferred embodiment of the present invention, and because of the difference in level between the pattern region 1A and the reverse pattern region 1B, the pattern region 1A only is bonded to the supporting substrate 3. Furthermore, in the case where the coefficient of linear expansion of the functional material substrate 1 largely differs from the coefficient of linear expansion of the supporting substrate 3, for example, in the case where lithium tantalate and lithium niobate are bonded to each other, it is preferable to use a normal-temperature direct bonding method, such as a clean bonding method in which the substrate surface is activated by plasma at normal temperature and bonding is performed in vacuum. In this case, if an insulating film made of $SiO_2$, SiN, or the like is provided on the bonding surface, the bonding strength increases, which is more preferable.

Next, the composite substrate 5 is placed in a heating atmosphere. Thereby, microcavities are generated and grow in the release layer 1C, and a thin film composed of a functional material is separated (S16). In this process, since the film thickness is small locally at the boundary between the reverse pattern region 1B and the pattern region 1A, strain becomes concentrated at the boundary thereby causing cracks. As a result, the thin film composed of the functional material falls off from the reverse pattern region 1B, and the thin film composed of the functional material is separated from the pattern region 1A and remains as a device thin film 4 in the composite substrate 5. This step corresponds to the separating step according to a preferred embodiment of the present invention.

Figure 2:
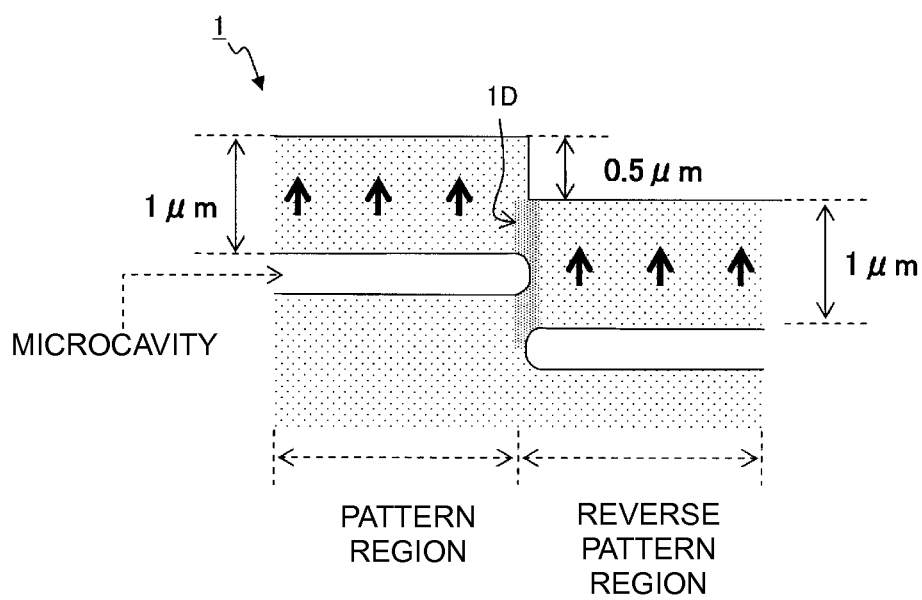
FIG. 2 is a diagram illustrating the state of the substrate in the separation step shown in FIG. 1.

FIG. 2 is a diagram illustrating the state of the substrate of the functional material substrate 1 in the separation step.

In the functional material substrate 1, when heated in the separating step, micro-cavities are generated in the release layer 1C located at a certain distance from the surface of each of the pattern region 1A and the reverse pattern region 1B, thus raising a region on the surface side. The upper side in FIG. 2 of the pattern region 1A is bonded to the supporting substrate 3. There is a gap between the reverse pattern region 1B and the supporting substrate 3. At the boundary portion 1D between the pattern region 1A and the reverse pattern region 1B, the film thickness is extremely small as shown in FIG. 2. Therefore, strain and deflection concentrate on the boundary portion 1D. As microcavities grow, stress applied to the boundary portion 1D increases, and the boundary portion 1D is cut.

Referring back to FIG. 1, after the separating step (S16), the surface of the functional material substrate 1 from which the device thin film 4 has fallen off and the surface of the composite substrate 5 on which the device thin film 4 remains are each subjected to mirror finishing (S17). The functional material substrate 1 which has been subjected to mirror finishing is reused, thus increasing the material efficiency of the functional material substrate 1. In addition, depending on the etching depth and the depth at which microcavities concentrate, there may be a case where separation of the device thin film 4 and falling off of the functional material thin film from the reverse pattern region 1B do not occur naturally or burrs occur on the edge of the device thin film 4. In such a case, during the mirror finishing or before the mirror finishing, etching or the like may be performed in the vicinity of the boundary between the pattern region and the reverse pattern region so as to facilitate separation or remove burrs.

The composite substrate 5 including the supporting substrate 3 and the device thin film 4 is formed by undergoing the steps described above. In this example, since the functional material substrate 1 which is formed by patterning in advance in the pattern forming step is used, the device thin film 4 can be patterned by separating the thin film composed of the functional material in the pattern region 1A at the release layer 1C. Consequently, the amount of etching of the functional material substrate 1 can be reduced, and it is possible to prevent undesirable effects of etching, such as the processing time, damage, and sticking of the resist, on the functional material substrate 1.

Furthermore, the method of manufacturing a composite substrate according to a preferred embodiment of the present invention can be applied to various functional material substrates. For example, it is possible to use substrates for semiconductors, such as Si, GaAs, and SiC; oxide substrates, such as sapphire and quartz; and piezoelectric substrates, such as lithium tetraborate, lithium tantalate, and lithium niobate. It is also possible to produce the structures described in Japanese Unexamined Patent Application Publication No. 2000-150835 and Japanese Unexamined Patent Application Publication No. 2001-244444.

A method for manufacturing a composite substrate according to a second preferred embodiment of the present invention will now be described.

In this preferred embodiment, the present invention is preferably applied to a method for manufacturing a bulk wave element device, which is a piezoelectric device, and a single-crystalline piezoelectric substrate is used as a functional material substrate.

Figure 3:
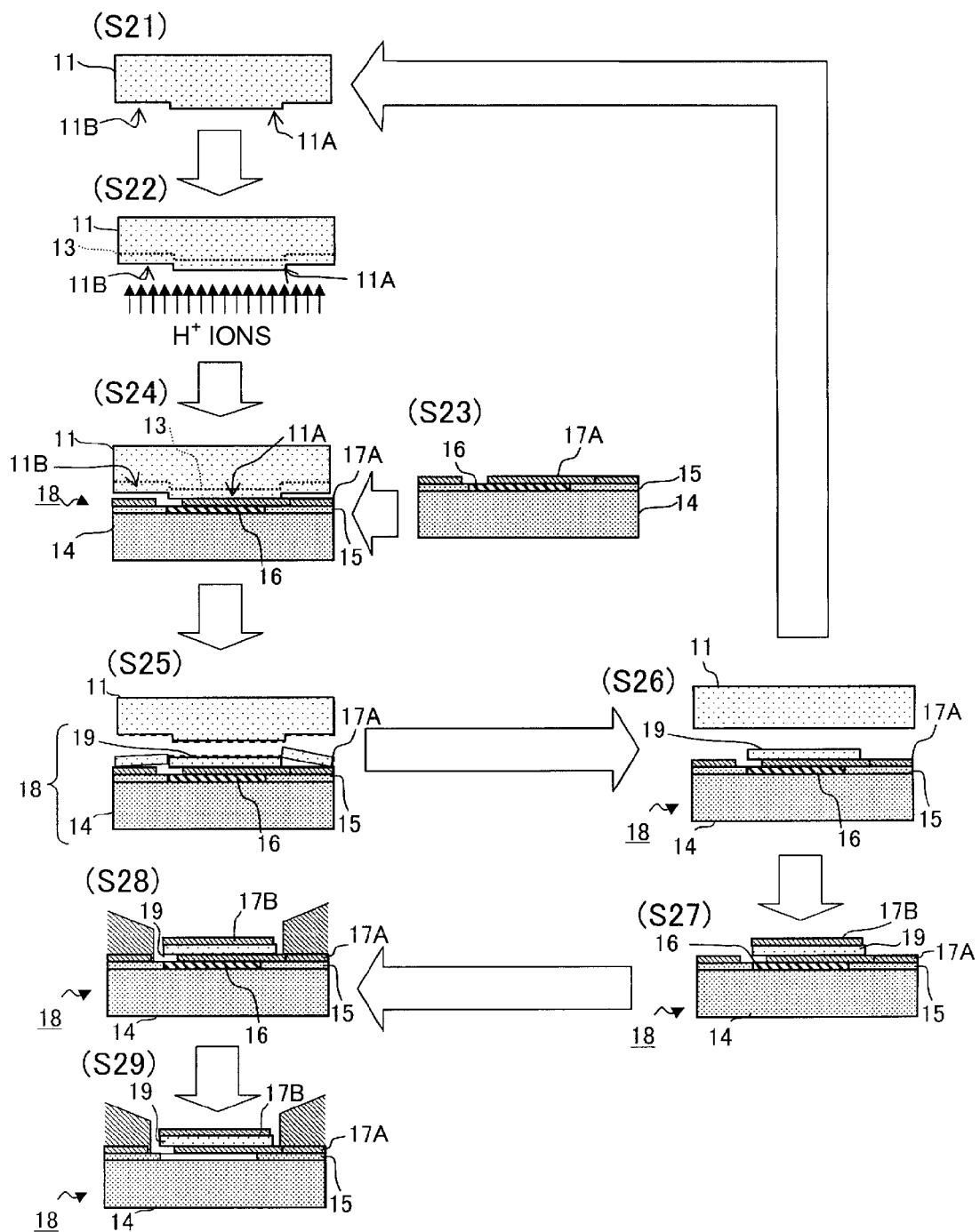
FIG. 3 is a flow chart of a manufacturing method according to a second preferred embodiment of the present invention, showing the state of the substrate in each step.

FIG. 3 is a flow chart of a method for manufacturing a bulk wave element device according to this preferred embodiment, showing the state of the substrate in each step.

First, a single-crystalline piezoelectric substrate 11 having a flat principal surface that has been subjected to mirror polishing is prepared. A reverse pattern region 11B and a pattern region 11A are formed on the principal surface of the single-crystalline piezoelectric substrate 11 by etching or the like (S21). As the single-crystalline piezoelectric substrate 11, lithium tantalate or lithium niobate may preferably be used, for example. Here, the etching depth in the single-crystalline piezoelectric substrate 11 preferably is about 0.5 μm, for example. This step corresponds to the pattern forming step according to a preferred embodiment of the present invention.

Next, hydrogen ions are implanted from the surface of each of the pattern region 11A and the reverse pattern region 11B of the single-crystalline piezoelectric substrate 11 (S22). The hydrogen ion implantation energy preferably is set at 150 KeV, and the dose (ion implantation density) preferably is set at $9 \times 10^{16}$ atom/cm$^2$, for example. Thereby, a release layer 13 is formed inside at a certain distance from the surface of each of the pattern region 11A and the reverse pattern region 11B. Here, the depth at which the release layer 13 is formed preferably is about 1.0 μm, for example. This step corresponds to the ion implanting step according to a preferred embodiment of the present invention.

Furthermore, a supporting substrate 14 is prepared. A bonding layer 15, a sacrificial layer 16, and an electrode film 17A are formed on the principal surface of the supporting substrate 14, and the surface thereof is smoothed by chemical mechanical polishing (CMP) (S23). Here, the bulk wave element device has a membrane structure having a vibrating space (a hollow cavity structure). Accordingly, the bonding layer 15 is formed by patterning, the sacrificial layer 16 is formed in the recess of the bonding layer 15, and the electrode film 17A, which is to constitute a lower-side electrode and wiring, is formed on the upper surface of the bonding layer 15 and the sacrificial layer 16. As the supporting substrate 14, Si, quartz, glass, sapphire, or the like may preferably be used, for example. As the bonding layer 15, an insulating film, such as $SiO_2$ or SiN, may preferably be used, for example. As the sacrificial layer 16, phosphosilicate glass, metal, Si, $SiO_2$, or the like may be used, for example. The entire supporting substrate 14 provided with the bonding layer 15, the sacrificial layer 16, and the electrode film 17A corresponds to the supporting substrate according to a preferred embodiment of the present invention.

Next, the single-crystalline piezoelectric substrate at the pattern region 11A is directly bonded to the upper surface of the electrode film 17A to form a composite substrate 18 (S24). This step corresponds to the bonding step according to a preferred embodiment of the present invention, and because of the difference in level between the pattern region 11A and the reverse pattern region 11B, the pattern region 11A only is bonded to the upper surface of the electrode film 17A.

Next, the composite substrate 18 is placed in a heating atmosphere at 500° C., and microcavities are generated and grown in the release layer 13 (S25). Because of the growth of microcavities, a device thin film 19 is separated from the pattern region 11A and remains in the composite substrate 18. In this process, since the film thickness is small locally at the boundary between the reverse pattern region 11B and the pattern region 11A, strain concentrates on the boundary to cause cracks. As a result, the thin film composed of the functional material falls off from the reverse pattern region 11B. Here, in order to eliminate the need to separately provide a via hole for introducing an etchant to the sacrificial layer 16, the shape of the reverse pattern region 11B is preset such that the sacrificial layer 16 is exposed in this step. This step corresponds to the separating step according to a preferred embodiment of the present invention.

Next, the surface of the single-crystalline piezoelectric substrate 11 from which the device thin film 19 has fallen off and the surface of the composite substrate 18 on which the device thin film 19 remains are each subjected to mirror finishing (S26). The single-crystalline piezoelectric substrate 11 which has been subjected to mirror finishing is reused, thus increasing the material efficiency of the single-crystalline piezoelectric substrate 11.

Next, an electrode film 17B, which is to constitute an upper-side electrode, is formed on the upper surface of the device thin film 19 of the composite substrate 18 (S27). The formation of the electrode film 17B is achieved, for example, by forming an aluminum electrode by pattering using photolithography and vapor deposition.

Next, for example, using photolithography and vapor deposition, aluminum is applied thickly onto wiring for connecting the electrode films 17A and 17B to external terminals (S28). In this step, wiring resistance can be minimized by increasing the thickness of the wiring at positions not overlapping the electrode films 17A and 17B.

Next, by introducing an etchant, the sacrificial layer is removed by etching (S29). As the etchant, a material having high reactivity with the sacrificial layer 16 and significantly low reactivity with other constitutional materials is preferably used. This step may be achieved by dry etching.

Then, by packaging the composite substrate 18, a bulk wave element device is produced.

The bulk wave element device including the supporting substrate 14 and the device thin film 19 is formed by undergoing the steps described above. In the example described above, since the sacrificial layer is exposed by etching and falling off of the reverse pattern region 11B, the etching time of the single-crystalline piezoelectric substrate 11 can be reduced, and productivity of the composite substrate and the piezoelectric device is enhanced.

Furthermore, by separating the device thin film 19 from the single-crystalline piezoelectric substrate 11, the cut angle in the device thin film 19 can be arbitrarily set, and it is possible to obtain the optimum cut angle for the characteristics of the bulk wave device by controlling the inclination of the crystal axis or polarization axis of the piezoelectric substance.

A method for manufacturing a composite substrate according to a third preferred embodiment of the present invention will now be described.

In this preferred embodiment, the present invention is preferably applied to a method for manufacturing a plate wave element device, which is a piezoelectric device, and a single-crystalline piezoelectric substrate is used as a functional material substrate.

Figure 4:
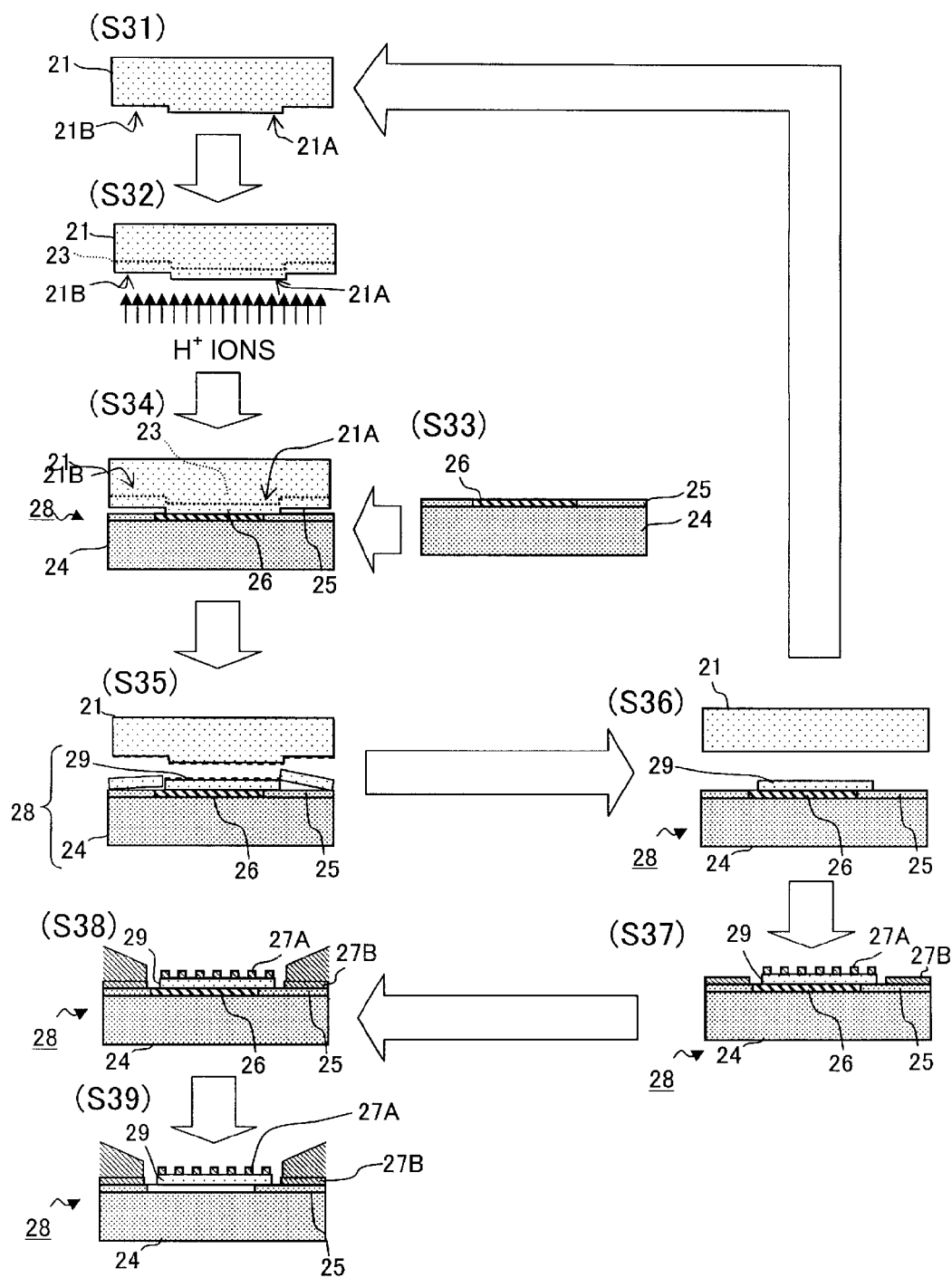
FIG. 4 is a flow chart of a manufacturing method according to a third preferred embodiment of the present invention, showing the state of the substrate in each step.

FIG. 4 is a flow chart of a method for manufacturing a plate wave element device according to this preferred embodiment, showing the state of the substrate in each step.

First, a single-crystalline piezoelectric substrate 21 having a flat principal surface that has been subjected to mirror polishing is prepared. A reverse pattern region 21B and a pattern region 21A are formed on the principal surface of the single-crystalline piezoelectric substrate 21 by etching or the like (S31). As the single-crystalline piezoelectric substrate 21, lithium tantalate or lithium niobate may preferably be used. Here, the etching depth in the single-crystalline piezoelectric substrate 21 preferably is about 0.5 μm, for example. This step corresponds to the pattern forming step according to a preferred embodiment of the present invention.

Next, hydrogen ions are implanted from the surface of each of the pattern region 21A and the reverse pattern region 21B of the single-crystalline piezoelectric substrate 21 (S32). The hydrogen ion implantation energy is preferably set at 150 KeV, and the dose (ion implantation density) is preferably set at $9 \times 10^{16}$ atom/cm$^2$, for example. Thereby, a release layer 23 is formed inside at a certain distance from the surface of each of the pattern region 21A and the reverse pattern region 21B. Here, the depth at which the release layer 23 is formed preferably is about 1.0 μm, for example. This step corresponds to the ion implanting step of the present invention.

Furthermore, a supporting substrate 24 is prepared. A bonding layer 25 and a sacrificial layer 26 are formed on the principal surface of the supporting substrate 24, and the surface thereof is smoothed by chemical mechanical polishing (CMP) (S33). Here, the plate wave element device has a membrane structure having a vibrating space (a hollow cavity structure). Accordingly, the bonding layer 25 is formed by patterning, and the sacrificial layer 26 is formed in the recess of the bonding layer 25. As the supporting substrate 24, Si, quartz, glass, sapphire, or the like may preferably be used, for example. As the bonding layer 25, an insulating film, such as SiO$_2$ or SiN, may preferably be used, for example. As the sacrificial layer 26, phosphosilicate glass, metal, Si, SiO$_2$, or the like may preferably be used. The entire supporting substrate 24 provided with the bonding layer 25 and the sacrificial layer 26 corresponds to the supporting substrate according to a preferred embodiment of the present invention.

Next, the single-crystalline piezoelectric substrate at the pattern region 21A is directly bonded to the upper surface of the bonding layer 25 and the sacrificial layer 26 to form a composite substrate 28 (S34). This step corresponds to the bonding step according to a preferred embodiment of the present invention, and because of the difference in level between the pattern region 21A and the reverse pattern region 21B, the pattern region 21A only is bonded to the upper surface of the bonding layer 25 and the sacrificial layer 26.

Next, the composite substrate 28 is placed in a heating atmosphere at 500° C., and microcavities are generated and grown in the separation layer 23 (S35). Because of the growth of microcavities, a device thin film 29 is separated from the pattern region 21A and remains in the composite substrate 28. In this process, since the film thickness is small locally at the boundary between the reverse pattern region 21B and the pattern region 21A, strain concentrates on the boundary to cause cracks. As a result, the thin film composed of the functional material falls off from the reverse pattern region 21B. Here, in order to eliminate the need to separately provide a via hole for introducing an etchant to the sacrificial layer 26, the shape of the reverse pattern region 21B is preset such that the sacrificial layer 26 is exposed in this step. This step corresponds to the separating step of the present invention.

Next, the surface of the single-crystalline piezoelectric substrate 21 from which the device thin film 29 has fallen off and the surface of the composite substrate 28 on which the device thin film 29 remains are each subjected to mirror finishing (S36). The single-crystalline piezoelectric substrate 21 which has been subjected to mirror finishing is reused, thus increasing the material efficiency of the single-crystalline piezoelectric substrate 21.

Next, an IDT electrode (comb-shaped electrode) 27A is formed on the upper surface of the device thin film 29 of the composite substrate 28, and wiring 27B is formed on the upper surface of the bonding layer 25 (S37). The formation of the IDT electrode 27A and the wiring 27B are achieved, for example, by forming an aluminum electrode by pattering using photolithography and vapor deposition.

Next, for example, using photolithography and vapor deposition, aluminum is applied thickly onto the wiring 27B for connecting the IDT electrode 27A to external terminals (S39). In this step, wiring resistance can be prevented by increasing the thickness of the wiring at positions not overlapping the IDT electrode 27A.

Next, by introducing an etchant, the sacrificial layer is removed by etching (S38). As the etchant, a material having high reactivity with the sacrificial layer 26 and significantly low reactivity with other constitutional materials is selected. This step may be achieved by dry etching.

Then, by packaging the composite substrate 28, a plate wave element device is produced.

The plate wave element device including the supporting substrate 24 and the device thin film 29 is formed by undergoing the steps described above. In the example described above, since the sacrificial layer is exposed by etching and falling off of the reverse pattern region 21B, the etching time of the single-crystalline piezoelectric substrate 21 can be reduced, and productivity of the composite substrate and the piezoelectric device is enhanced.

Furthermore, by separating the device thin film 29 from the single-crystalline piezoelectric substrate 21, the cut angle in the device thin film 29 can be arbitrarily set, and it is possible to obtain the optimum cut angle for the characteristics of the plate wave device by controlling the inclination of the crystal axis or polarization axis of the piezoelectric substance.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for manufacturing a composite substrate comprising:

a pattern forming step in which a pattern region having a predetermined pattern and a reverse pattern region that is lower than the pattern region are formed on a principal surface of a piezoelectric substrate;

an ion implanting step including implanting ions into the pattern region and the reverse pattern region to form a release layer inside at a certain distance from the surface of the pattern region;

a bonding step in which the piezoelectric substrate at the pattern region is bonded to a flat principal surface of a supporting substrate; and a separating step in which a piezoelectric thin film is separated from the pattern region of the piezoelectric substrate, and the piezoelectric thin film is made to fall off from the reverse pattern region of the piezoelectric substrate; wherein a difference in level between the pattern region and the reverse pattern region is smaller than a thickness of the piezoelectric thin film.

2. The method for manufacturing a composite substrate according to claim 1, wherein the piezoelectric substrate is a single-crystalline piezoelectric substrate of lithium tantalate or lithium niobate; the piezoelectric thin film bonded to the supporting substrate is a bulk wave device thin film or a plate wave device thin film; the supporting substrate is provided with a vibrating space for the device thin film; and the method includes, after the separating step, a step of introducing an etchant for a sacrificial layer provided in the vibrating space from the position where the piezoelectric thin film has fallen off.

* * * * *